United States Patent
Chen (10) Patent No.: US 9,716,223 B1
(45) Date of Patent: Jul. 25, 2017

(54) RRAM DEVICE AND METHOD FOR MANUFACTURING THE SAME

(71) Applicant: Winbond Electronics Corp., Taichung (TW)

(72) Inventor: Frederick Chen, Zhubei (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/204,215

(22) Filed: Jul. 7, 2016

(51) Int. Cl.
    *H01L 47/00* (2006.01)
    *H01L 45/00* (2006.01)
    *H01L 27/24* (2006.01)

(52) U.S. Cl.
    CPC ...... *H01L 45/1246* (2013.01); *H01L 27/2463* (2013.01); *H01L 45/085* (2013.01); *H01L 45/1233* (2013.01); *H01L 45/1266* (2013.01); *H01L 45/146* (2013.01); *H01L 45/1625* (2013.01)

(58) Field of Classification Search
    CPC .............. H01L 45/1246; H01L 45/085; H01L 45/1233; H01L 27/2463; H01L 45/146; H01L 45/1625; H01L 45/1266
See application file for complete search history.

(56) References Cited

U.S. PATENT DOCUMENTS

| | | | |
|---|---|---|---|
| 9,123,640 B2 | 9/2015 | Khoueir et al. | |
| 2002/0022357 A1* | 2/2002 | Iijima | H01L 27/10855 438/622 |
| 2012/0091418 A1* | 4/2012 | Chen | H01L 45/08 257/4 |
| 2012/0091419 A1* | 4/2012 | Chen | H01L 45/08 257/4 |
| 2015/0069315 A1 | 3/2015 | Shih et al. | |
| 2016/0315255 A1* | 10/2016 | Chen | H01L 45/1266 |

* cited by examiner

*Primary Examiner* — Victor A Mandala
(74) *Attorney, Agent, or Firm* — Muncy, Geissler, Olds & Lowe, P.C.

(57) ABSTRACT

A resistive random access memory device includes a bottom electrode, a plurality of memory stacks separately formed over the bottom electrode, a third oxygen diffusion barrier layer formed between the memory stacks, and a top electrode formed over the plurality of memory stacks and the third oxygen diffusion barrier layer. Each of the plurality of memory stacks includes a resistive switching layer formed over the bottom electrode, a first oxygen diffusion barrier layer formed over the resistive switching layer, a conductive oxygen reservoir layer formed over the first oxygen diffusion barrier layer, and a second oxygen diffusion barrier layer formed over the conductive oxygen reservoir layer.

20 Claims, 11 Drawing Sheets

RRAM DEVICE AND METHOD FOR MANUFACTURING THE SAME

BACKGROUND OF THE INVENTION

Field of the Invention

The disclosure relates to a resistive random access memory (RRAM) device, and in particular it relates to a resistive random access memory (RRAM) device having a plurality of patterned memory stacks, and a method for manufacturing the same.

Description of the Related Art

The resistive random access memory (RRAM) device has become a major stream of the newly developed non-volatile memory due to the following advantages: low power consumption, low operation voltage, short write and erase times, long endurance, long data retention time, non-destructive read operation, multi-state memory, being simple to manufacture, and having scalable properties. The basic structure of the RRAM device includes a metal-insulator-metal (MIM) stack of a bottom electrode, a resistive switching layer, and a top electrode. The resistive switching (RS) property is an important property of the RRAM device. For example, when a writing voltage (turn-on voltage) is applied to the RRAM device, the oxygen atoms in the resistive switching layer may migrate to the top electrode to achieve the RS effect. However, the oxygen atoms may diffuse back to the resistive switching layer or even escape out of the top electrode to render the RRAM device ineffective.

Accordingly, a novel RRAM device and method for manufacturing the same for overcoming the above shortcomings are called-for.

BRIEF SUMMARY OF THE INVENTION

An exemplary resistive random access memory device comprises a bottom electrode, a plurality of memory stacks separately formed over the bottom electrode, a third oxygen diffusion barrier layer formed between the memory stacks, and a top electrode formed over the plurality of memory stacks and the third oxygen diffusion barrier layer. Each of the plurality of memory stacks comprises a resistive switching layer formed over the bottom electrode, a first oxygen diffusion barrier layer formed over the resistive switching layer, a conductive oxygen reservoir layer formed over the first oxygen diffusion barrier layer, and a second oxygen diffusion barrier layer formed over the conductive oxygen reservoir layer.

An exemplary manufacturing a resistive random access memory device comprises forming a bottom electrode, forming a plurality of memory stacks separately over the bottom electrode, forming a third oxygen diffusion barrier layer between the memory stacks, forming a top electrode over the plurality of memory stacks and the third oxygen diffusion barrier layer. Each of the plurality of memory stacks comprises a resistive switching layer formed over the bottom electrode, a first oxygen diffusion barrier layer formed over the resistive switching layer, a conductive oxygen reservoir layer formed over the first oxygen diffusion barrier layer, and a second oxygen diffusion barrier layer formed over the conductive oxygen reservoir layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1, 3-5 are schematic cross sections showing a method for forming an exemplary resistive random access memory (RRAM) device.

Figure 1:
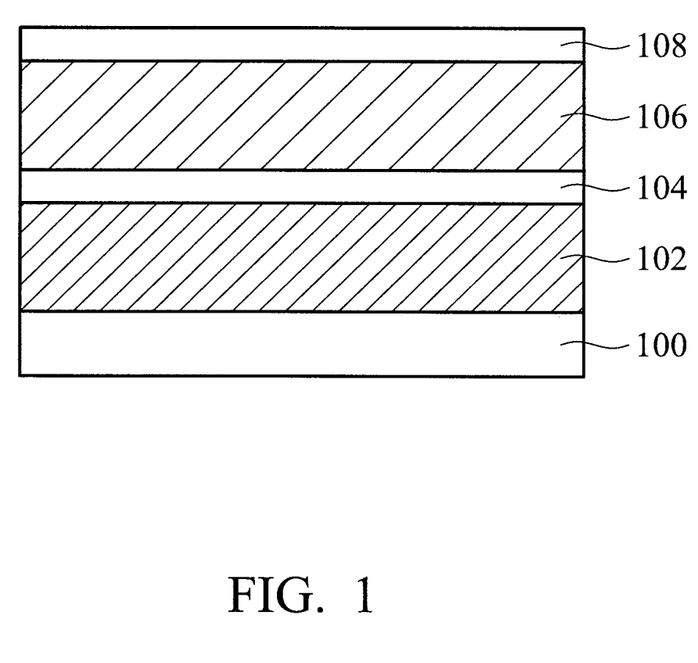
FIG. 1 is a schematic cross section showing a method for manufacturing a resistive random access memory device according to an embodiment of the invention.

In FIG. 1, a semiconductor structure (not shown) with a bottom electrode 100 formed over the semiconductor structure is provided. The semiconductor structure comprises at least a semiconductor substrate (not shown) such as a silicon wafer and a memory controlling element (not shown) such as an active controlling element (e.g. a transistor) or a passive controlling element (e.g. a conductive line) formed over the semiconductor substrate. At this time, the bottom electrode 100 may be a patterned conductive layer formed in a portion of an insulating layer (not shown). Next, a resistive switching layer 102 is formed over the bottom electrode 100, and a first oxygen diffusion barrier layer 104 is then formed over the resistive switching layer 102. Next, a conductive oxygen reservoir layer 106 is formed over the first oxygen diffusion barrier layer 104, and a second oxygen diffusion barrier layer 108 is then formed over the conductive oxygen reservoir layer 106. The resistive switching layer 102, the first oxygen diffusion barrier layer 104, the conductive oxygen reservoir layer 106, and the second oxygen diffusion barrier layer 108 are film layers sequentially and blanketly formed over the bottom electrode 100 and the semiconductor structure.

In one embodiment, the bottom electrode 100 may comprise tungsten (W), platinum (Pt), aluminum (Al), titanium (Ti), titanium nitride (TiN), or a combination thereof with a thickness of 10 to 100 nm. The bottom electrode 100 may be formed by E-beam evaporation, sputtering, or physical vapor deposition (PVD). In another embodiment, the resistive switching layer 102 may comprise hafnium oxide, titanium oxide, tungsten oxide, tantalum oxide, zirconium oxide, or a combination thereof, and has a thickness of about 3 nm to 10 nm. The resistive switching layer 102 may be formed by E-beam evaporation, sputtering, or physical vapor deposition (PVD). In yet another embodiment, the first oxygen diffusion barrier layer 104 may comprise aluminum oxide, and has a thickness of about 0.3 nm to 1 nm. The first oxygen diffusion barrier layer 104 and may be formed by E-beam evaporation, sputtering, or physical vapor deposition (PVD). In another embodiment, the conductive oxygen reservoir layer 106 may comprise aluminum, titanium, or a combination thereof, and has a thickness of about 5 nm to 40 nm. The conductive oxygen reservoir layer 106 may be formed by E-beam evaporation, sputtering, or PVD. In yet another embodiment, the second oxygen diffusion barrier layer 108 may comprise aluminum oxide with a thickness of about 0.3 nm to 1 nm or titanium oxynitride (TiON) with a thickness about 3 nm to 10 nm. The second oxygen diffusion barrier layer 108 may be formed by E-beam evaporation, sputtering, or physical vapor deposition (PVD).

Figure 2A:
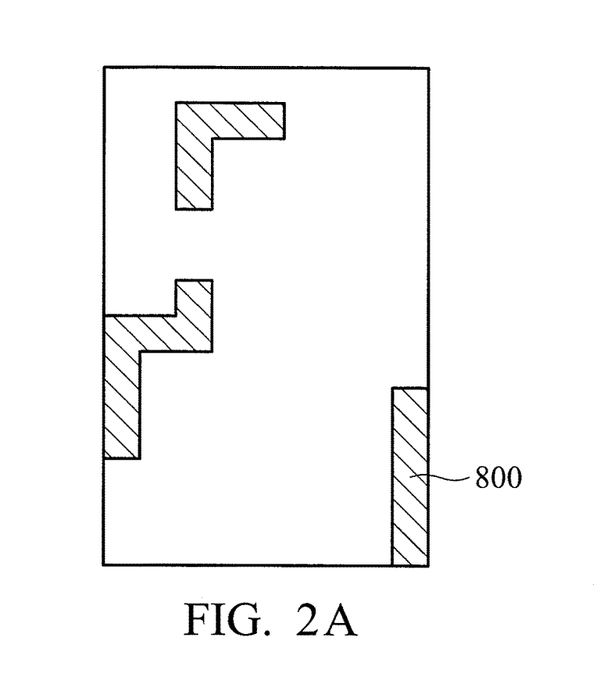
FIGS. 2A-2F are schematic top views showing a pattern process for forming memory stacks according to an embodiment of the invention.
Figure 2B:
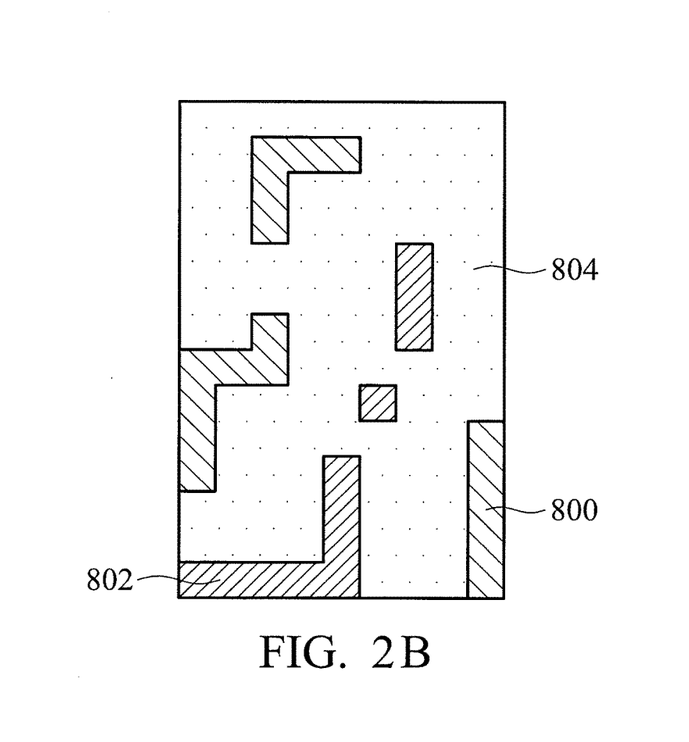
Figure 2C:
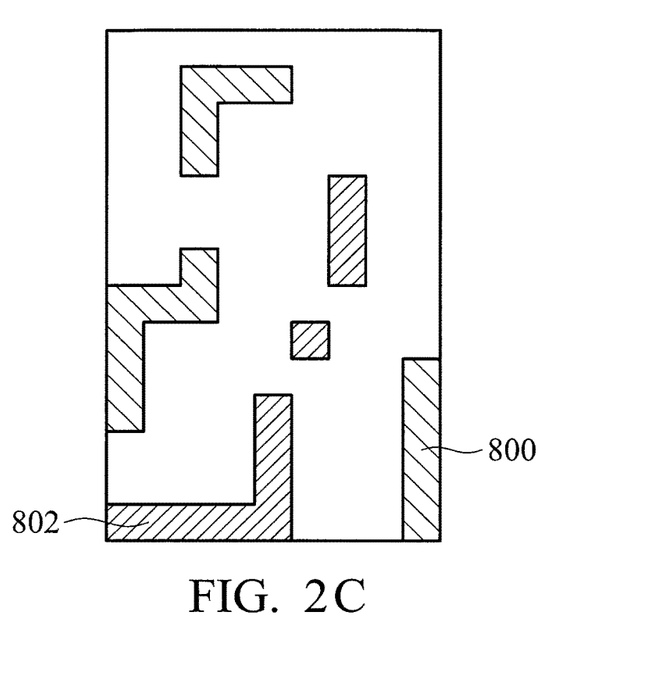
Figure 2D:
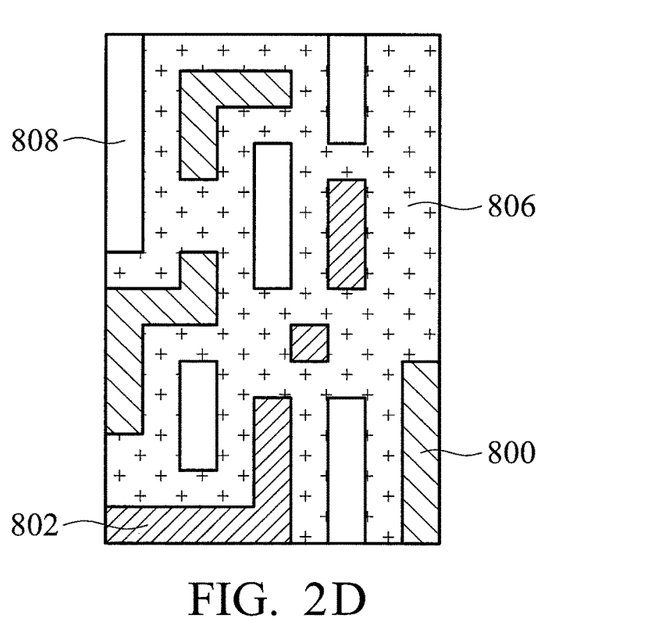
Figure 2E:
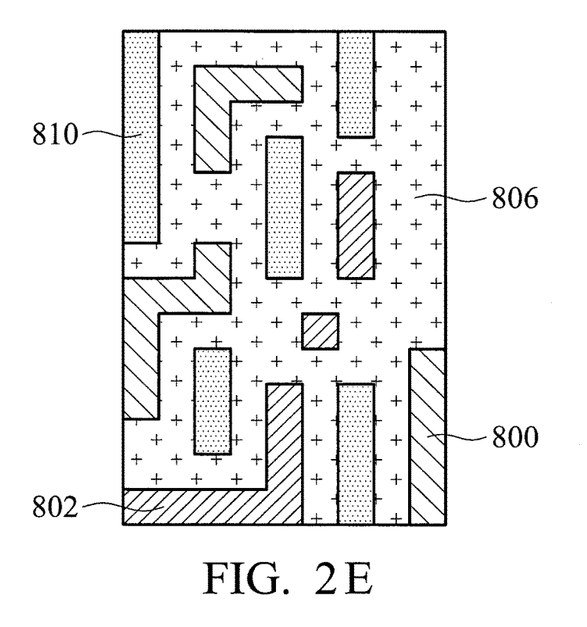
Figure 2F:
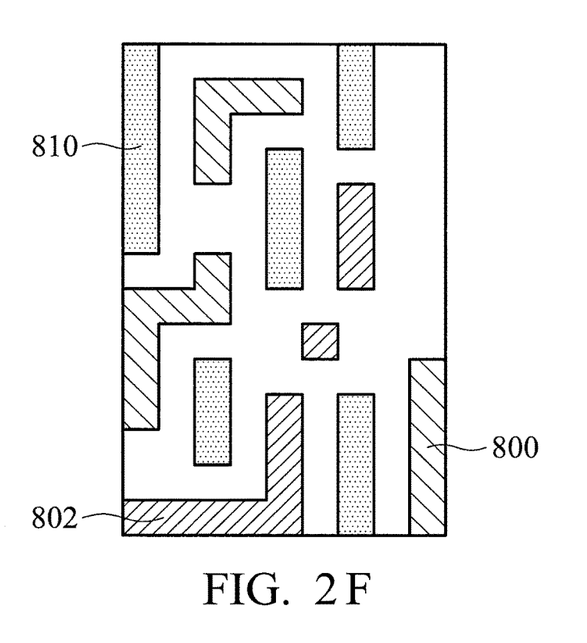
Figure 3:
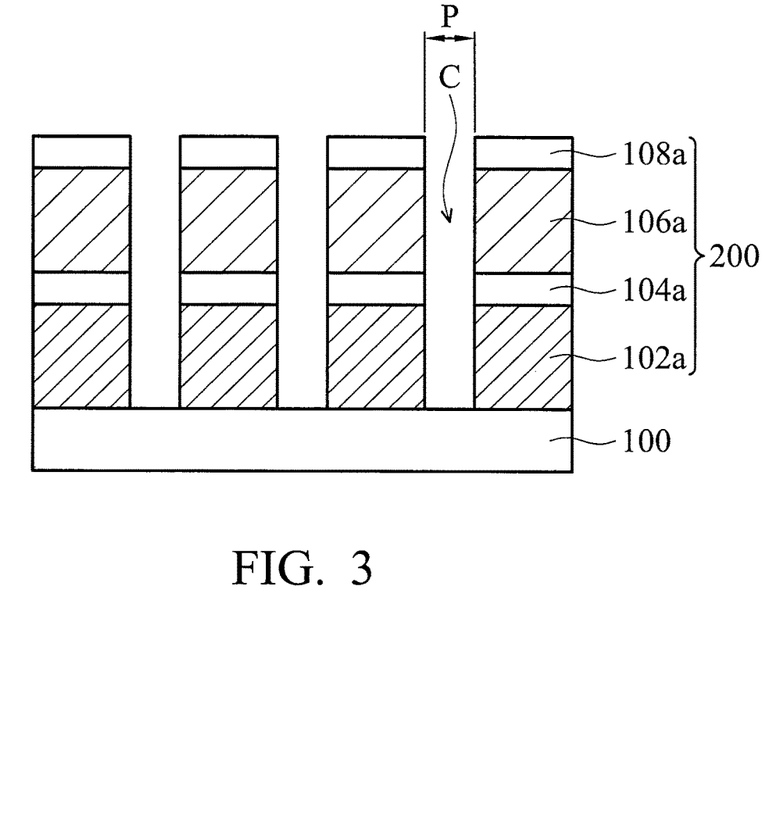
FIG. 3 is a schematic cross section showing a method for manufacturing a resistive random access memory device according to an embodiment of the invention.

Next, a patterning process is performed to pattern the second oxygen diffusion barrier layer 108, the conductive oxygen reservoir layer 106, the first oxygen diffusion barrier layer 104, and the resistive switching layer 102 by using suitable mask patterns (not shown), such that a plurality of memory stacks 200 are separately formed over the bottom electrode 100, see FIG. 3. Due to the need to form multiple features corresponding to one electrode, a multiple feature patterning as described below and illustrated in FIGS. 2A-2F is suggested. The patterns shown in FIGS. 2A-2F are merely examples and are not intended to be limiting. In FIG. 2A, a plurality of photoresist patterns 800 are formed on the second oxygen diffusion barrier 108. The photoresist patterns 800 can be used to define the shape of the top view of the memory stacks 200. However, lower density of the memory stacks 200 between the bottom electrode 100 and a top electrode 120 (shown in FIG. 10) could result in a lower filament forming cross section, thereby requiring a higher forming voltage or longer forming time to compensate. Therefore, it is preferable to have more memory stacks 200 between the bottom electrode 100 and a top electrode 120. FIG. 2B shows first hard mask patterns 802 formed in between the photoresist patterns 800, and separated by a spacer 804. The spacer 804 may be made from amorphous carbon or oxide formed by CVD. The first hard mask patterns 802 can be made from material including nitride formed by CVD process. The spacer 804 is then removed in FIG. 2C. In FIG. 2D, an additional spacer 806 is formed around the photoresist patterns 800 and the first hard mask patterns 802. The additional spacer 806 includes gaps 808 therein, in which the gaps 808 are disposed between the photoresist patterns 800 and the first hard mask patterns 802. The additional spacer 806 can be made from material including amorphous carbon, oxide formed by CVD or polysilicon. In FIG. 2E, a plurality of second hard mask patterns 810 are at least deposited into the gaps 808. The second hard mask patterns 810 can be made from material including nitride formed by CVD, amorphous carbon or TiN. Finally, in FIG. 2F, the additional spacers 806 are removed, thereby leaving a pattern for defining the shape of the top view of the memory stacks 200.

As shown in FIG. 3, a space P of about 10 nm-40 nm exists between every two of the adjacent memory stacks 200, thereby leaving space C between every two adjacent memory stacks 200 and exposing a portion of the bottom electrode 100. The space P may have the same width as the width of the memory stacks 200. In this embodiment, each of the plurality of memory stacks 200 comprises a patterned resistive switching layer 102a, a patterned first oxygen diffusion barrier layer 104a, a patterned conductive oxygen reservoir layer 106a, and a patterned second oxygen diffusion barrier layer 108a sequentially stacked over the bottom electrode 100.

Figure 4:
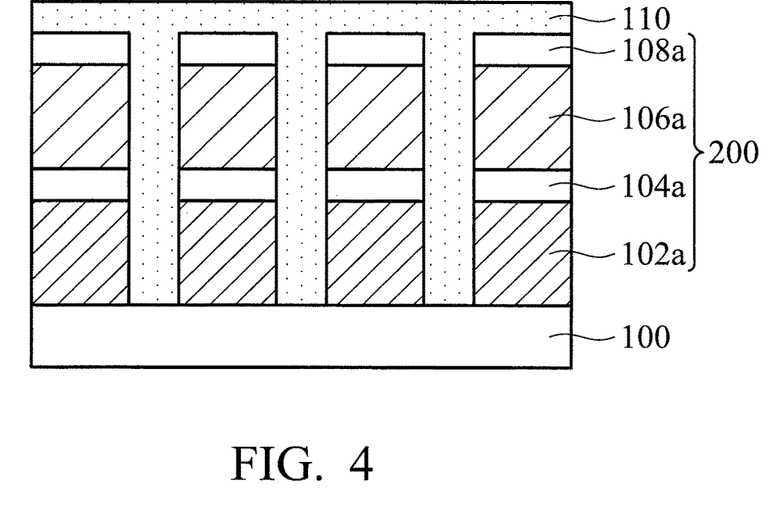
FIG. 4 is a schematic cross section showing a method for manufacturing a resistive random access memory device according to an embodiment of the invention.

In FIG. 4, a third oxygen diffusion barrier layer 110 is formed over the plurality of memory stacks 200 and the bottom electrode 100 and fills the space C between the adjacent memory stacks 200. In one embodiment, the third oxygen diffusion barrier layer 110 may comprise aluminum oxide and has a thickness of about 1 nm-10 nm over the memory stacks 200. The third oxygen diffusion barrier layer 110 may be formed by E-beam evaporation, sputtering, or physical vapor deposition (PVD).

Figure 5:
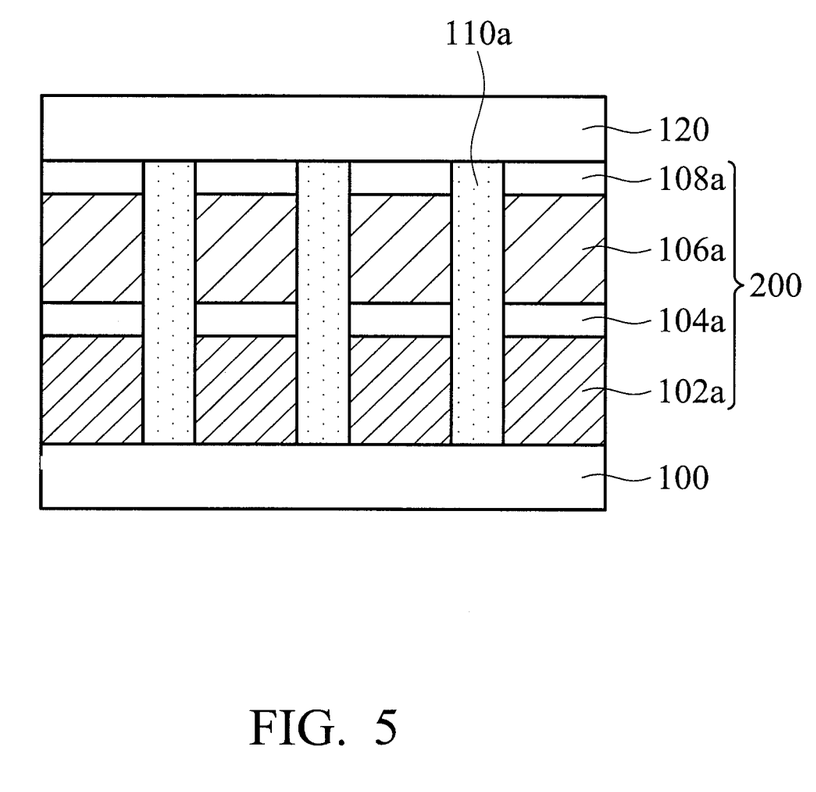
FIG. 5 is a schematic cross section showing a method for manufacturing a resistive random access memory device according to an embodiment of the invention.

In FIG. 5, a planarization process (not shown) such as a chemical mechanical polishing or an etching back process is performed to remove the portion of the third oxygen diffusion barrier layer 110 above the memory stacks 200, thereby leaving a patterned third oxygen diffusion barrier layer 110a in the space C between the memory stacks 200. Next, a top electrode 120 is formed over the memory stacks 200 and the patterned third oxygen diffusion barrier layer 110a, thereby forming a cell unit of the random access memory (RRAM) device. The top electrode 120 may comprise tungsten (W), platinum (Pt), aluminum (Al), titanium (Ti), titanium nitride (TiN), or a combination thereof, and has a thickness of about 30 nm-80 nm. The top electrode 120 may be formed by E-beam evaporation, sputtering, or physical vapor deposition (PVD).

Figure 6:
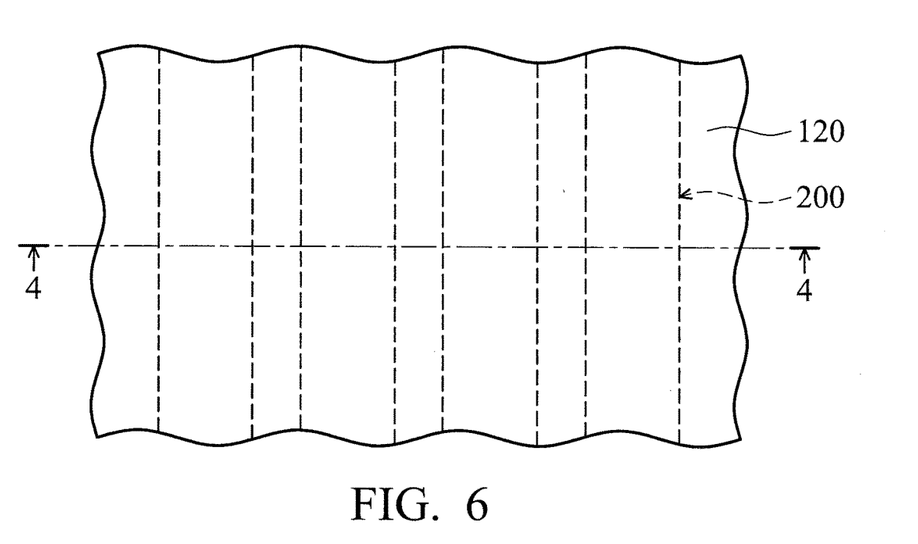
FIG. 6. is a schematic top view of the resistive random access memory device shown in FIG. 4 according to an embodiment of the invention.
Figure 7:
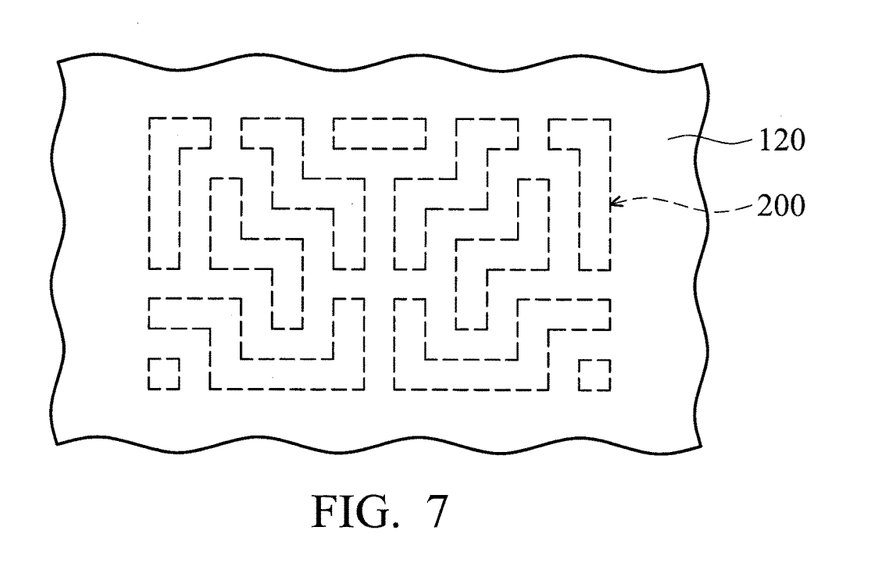
FIG. 7. is a schematic top view of the resistive random access memory device according to an embodiment of the invention.

As shown in FIG. 6, a schematic top view of the random access memory (RRAM) device is provided, and the random access memory (RRAM) device shown in FIG. 5 may be a schematic cross section taken along line 4-4 in FIG. 6. In one embodiment, the memory stacks 200 are isolated strips which are formed with strip-like configurations from the top view. In another embodiment, the strips can be bended, thereby having bended strip-like configurations from the top view, as shown in FIG. 7.

Figure 8:
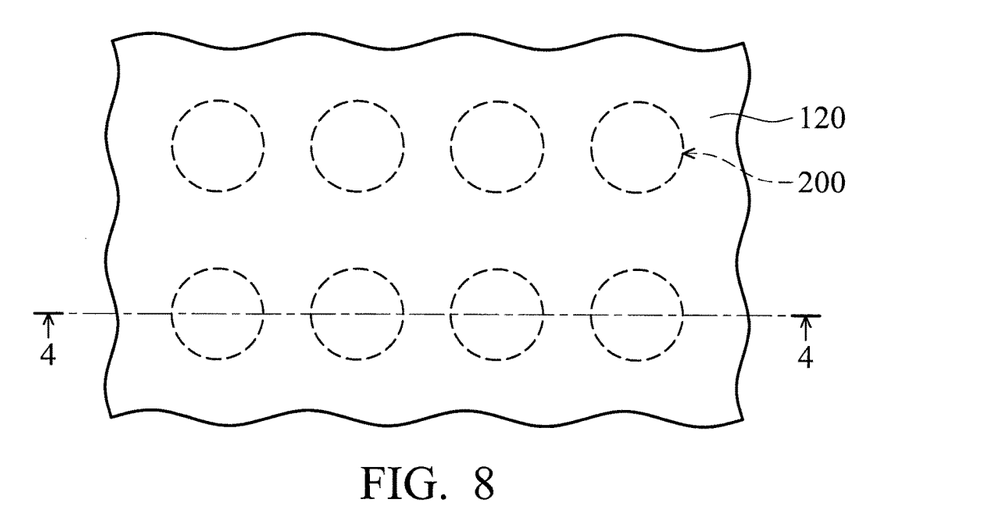
FIG. 8. is a schematic top view of the resistive random access memory device shown in FIG. 4 according to another embodiment of the invention.
Figure 9:
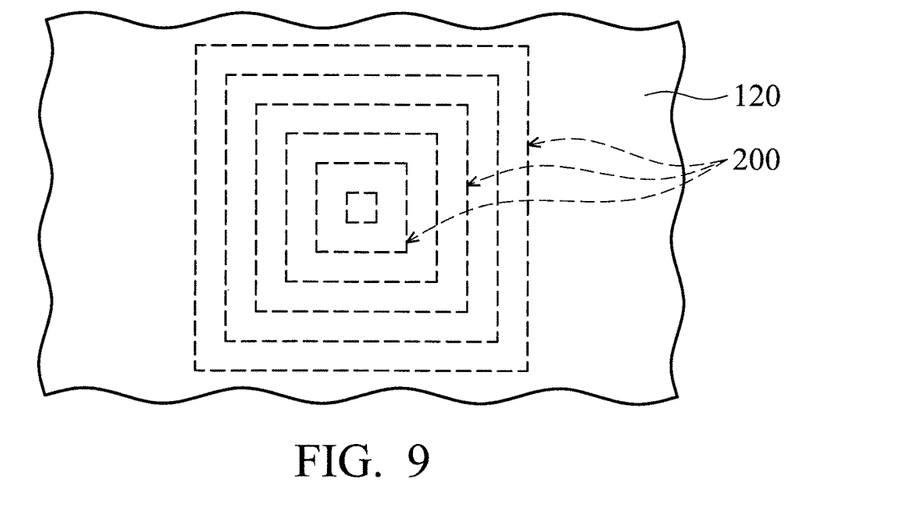
FIG. 9. is a schematic top view of the resistive random access memory device according to an embodiment of the invention.

As shown in FIG. 8, another schematic top view of the random access memory (RRAM) device is provided, and the random access memory (RRAM) device shown in FIG. 6 may be a schematic cross section taken along line 4-4 in FIG. 6. In this embodiment, the memory stacks 200 are isolated columns which are formed with a circle-like configuration from the top view. In another embodiment (not shown), the memory stacks 200 are isolated columns which are formed with a square-like configuration from the top view. But the invention is not limited thereto, the memory stacks can be any patterns which are formed symmetrically and spaced equally. In another embodiment, the memory stacks 200 may be formed with ring-shaped configurations from the top view, as shown in FIG. 9.

Figure 10:
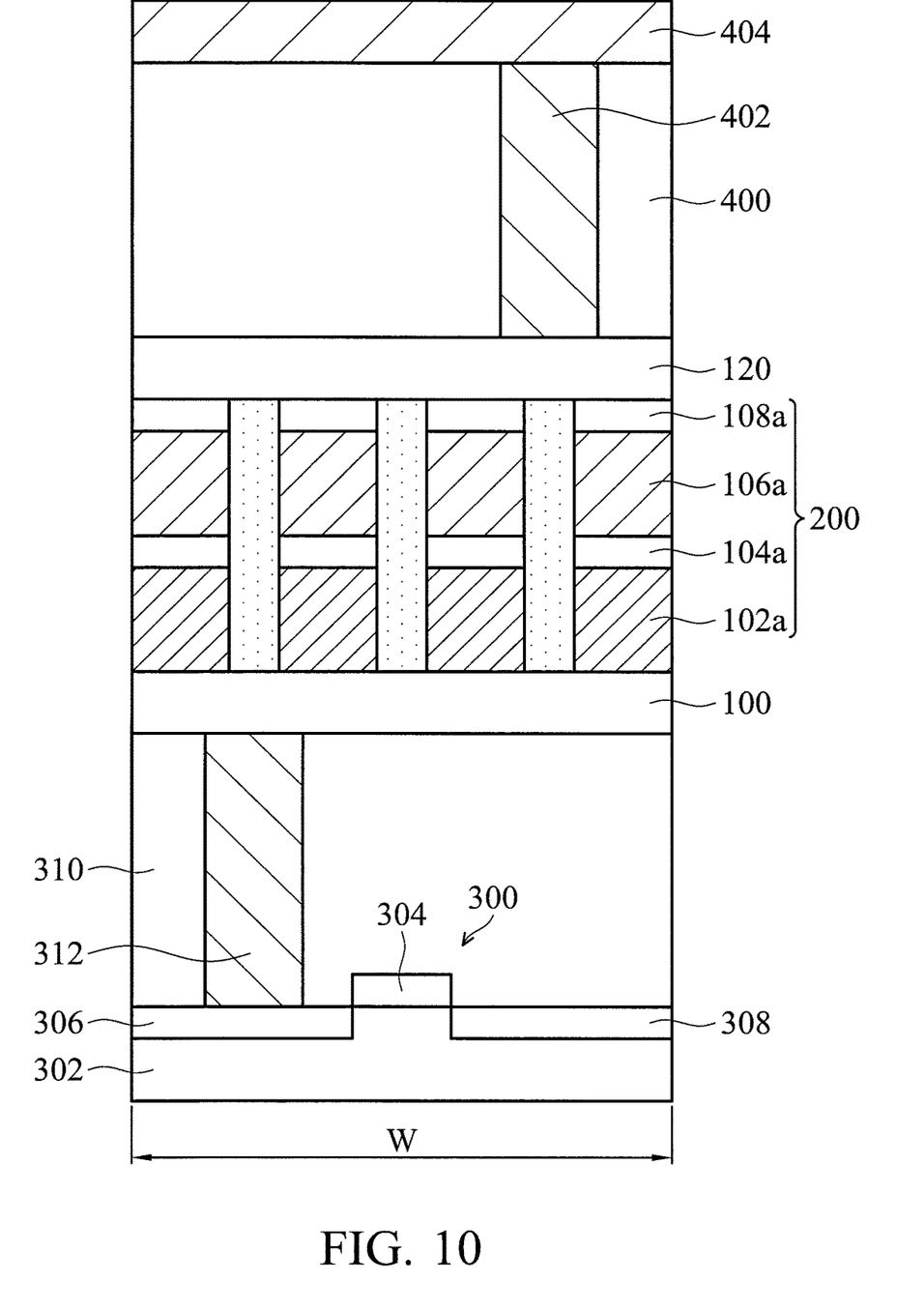
FIG. 10. is a schematic cross section of a resistive random access memory device according to an embodiment of the invention.

FIG. 10 is a schematic cross section of another exemplary resistive random access memory device. The RRAM device shown in FIG. 10 is modified from the RRAM device shown in FIG. 5, and the same reference numbers represent the same components, Differences between the RRAM devices shown in FIGS. 5 and 10 are discussed below.

As shown in FIG. 10, a transistor 300 is provided under the RRAM device shown in FIG. 5 for functioning as an active controlling element for the RRAM device. In this embodiment, the transistor 300 comprises a semiconductor substrate 302 such as a silicon wafer and a gate structure 304 formed over the semiconductor substrate 302. In one embodiment, the gate structure 304 may comprise a gate electrode (not shown) and a gate dielectric layer (not shown) interposed between the gate electrode and the semiconductor layer 302. In addition, the transistor 300 further comprises a drain region 306 and a source region 308 formed in a portion of the semiconductor substrate 302 adjacent to opposite sides of the gate structure 304. In addition, a dielectric layer 312 is formed over the transistor 300 and between the semiconductor substrate 302 and the bottom electrode 100, and a conductive contact 312 is formed in a portion of the dielectric layer 312 above the drain region 306 to physically contact the transistor 300 and the bottom electrode 100, thereby electrically connecting the source region 306 of the transistor 300 with one end (e.g. the left end) the bottom electrode 100. Moreover, another dielectric layer 400 is formed over the top electrode 120 and another conductive contact 402 is formed in a portion of the dielectric layer 400 above one end of the top electrode 120 that diagonally opposite to the end of the bottom electrode 100 physically connecting with the conductive contact 312. In addition, a conductive line 404 is formed over the dielectric layer 400 and the conductive contact 402. In this embodiment, the conductive line 404 may function as a bit-line and the gate electrode (not shown) of the gate structure 304 may function as a word-line, and a cell width of the RRAM device can match a width W of the transistor 300 such that allows larger area for manufacturing the RRAM device, thereby reducing a forming voltage and noise in the RRAM device.

Figure 11:
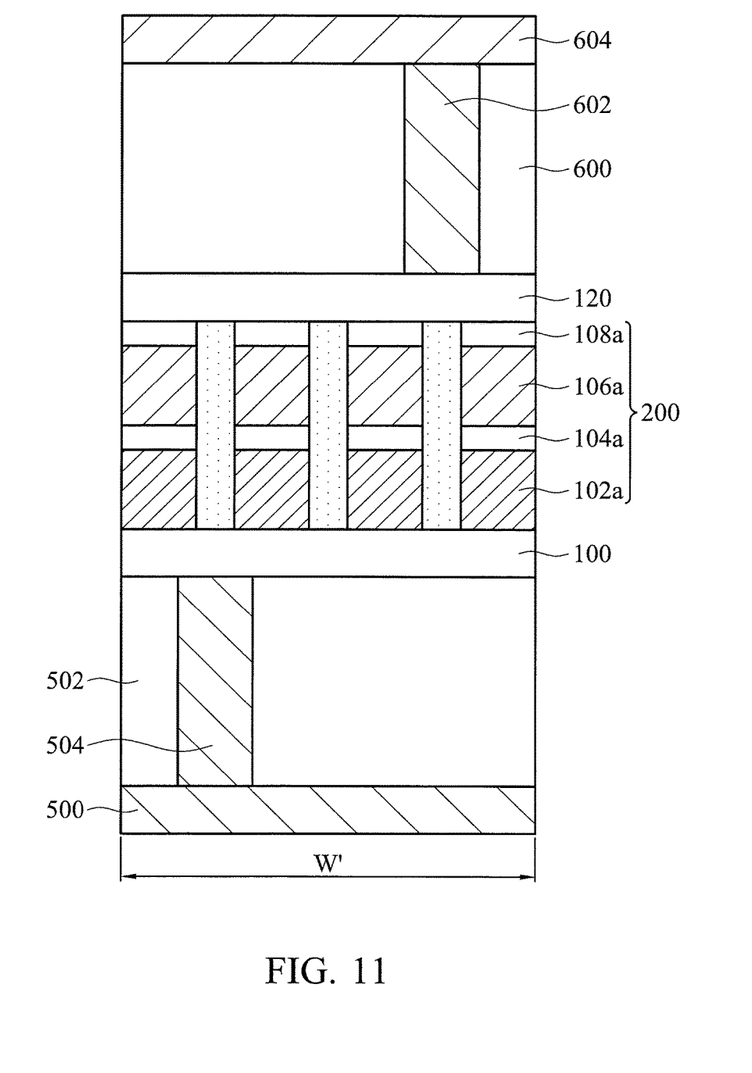
FIG. 11. is a schematic cross section of the resistive random access memory device according to another embodiment of the invention.

FIG. 11 is a schematic cross section of yet another resistive random access memory device. The RRAM device shown in FIG. 11 is modified from the RRAM device shown in FIG. 5, and the same reference numbers represent the same components. Differences between the RRAM devices shown in FIGS. 5 and 11 are discussed below.

As shown in FIG. 11, a conductive line 500 is provided under the RRAM structure shown in FIG. 5 for functioning as a passive controlling element for the RRAM device. In this embodiment, the conductive line 500 is formed in a dielectric layer (not shown) and a plurality of semiconductor components (not shown) may be provided under the conductive line 500. The conductive line 500 can be a conductive line and the dielectric layer can be an inter-metal dielectric (IMD) layer formed in the back-end-of-line (BEOL) process.

In addition, a dielectric layer 502 is formed over the conductive layer 500 and a conductive contact 504 is formed in a portion of the dielectric layer 502 over an end of the conductive contact 504, for example the left end, to physically contact the conductive line 500 and the RRAM device, thereby electrically connecting the RRAM device with the conductive line 500. Moreover, another dielectric layer 600 is formed over the top electrode 120 and another conductive contact 602 is formed in a portion of the dielectric layer 600 above an end (e.g. the right end) of the top electrode 120 that is diagonally opposite to the end of the bottom electrode 100 connecting with the conductive contact 602. In addition, a conductive line 604 is formed over the dielectric layer 600 and the conductive contact 602. In this embodiment, the conductive line 604 over the memory stacks 200 may function as a bit-line and the conductive line 500 under the memory stacks 200 may function as a word-line, and a cell width of the RRAM device can match a width W' of the conductive line 500/604 such that allows larger area for manufacturing the RRAM device, thereby reducing a forming voltage and noise in the RRAM device.

Therefore, fabrication of the RRAM device shown in FIG. 11 can be integrated in a back-end-of-line (BEOL) process of modern semiconductor fabrication.

Figure 12:
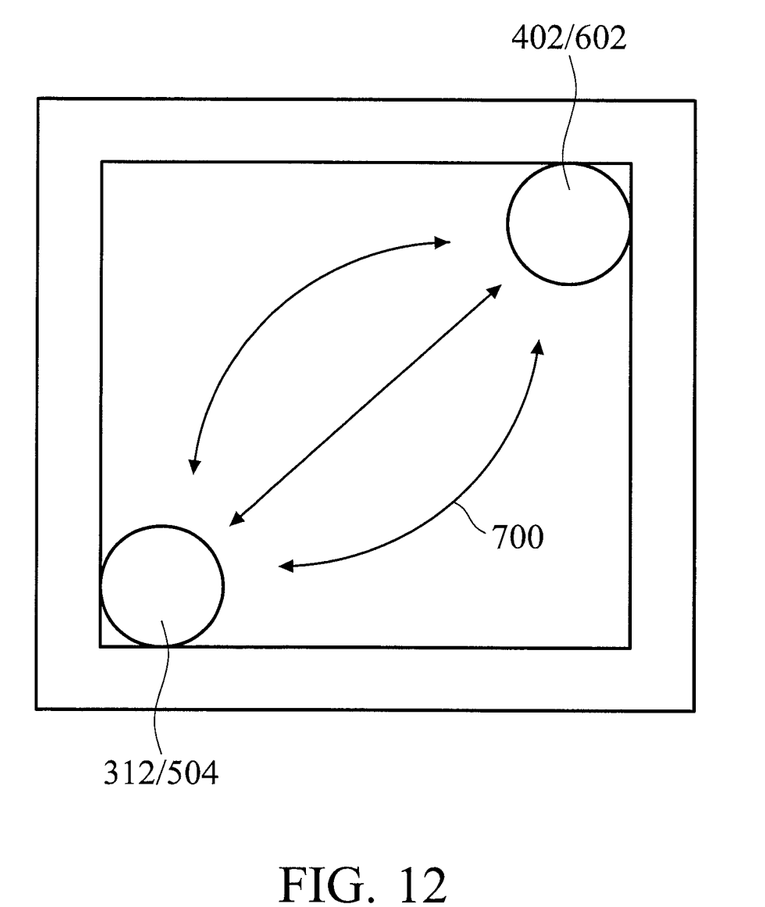
FIG. 12 is a schematic top view showing biasing paths of a resistive random access memory device according to an embodiment of the invention.

FIG. 12 is schematic top view showing operations of the resistive random access memory (RRAM) device shown in FIGS. 5 and 10-11. During the operation, once bias is applied to the RRAM device between the conductive contact 402/602 and the conductive contact 312/504, the plurality of memory stacks 200 of the RRAM device can be set or reset by a plurality of biasing paths 700 separately formed the RRAM device along the top electrode 120 and the bottom electrode 110 between the conductive contact 402/602 and the conductive contact 312/504; see FIG. 12.

The RRAM devices shown in FIGS. 5, 10 and 11 can be adopted to solve the oxygen diffusion problems of a conventional RRAM device having a planar resistive switching layer formed between the bottom electrode and the top electrode. The patterned resistive switching layer 102a, the patterned first oxygen diffusion barrier layer 104a, the patterned conductive oxygen reservoir layer 104a, and the patterned second oxygen diffusion barrier layer 106a of each of the memory stacks 200 formed between the top electrode 120 and the bottom electrode 100 allows dense localized filament, such that oxygen vacancies are easier to confine inside the conductive oxygen reservoir layer 104a in each of the memory stacks 200, and allows more stable filaments formed in the memory stacks and better filament reproducibility of the RRAM device. In addition, since the third oxygen diffusion barrier layer 110a is formed between every two of the adjacent memory stacks 200, such that oxygen diffusion can be confined within the individual memory stacks 200 and there is no oxygen diffusion between two adjacent memory stacks 200, thereby preventing the adjacent memory stacks 200 from interfering with each other and ensuring the functionality of the RRAM device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A resistive random access memory device, comprising:
a bottom electrode;
a plurality of memory stacks separately formed over the bottom electrode, wherein each of the plurality of memory stacks comprises:
 a resistive switching layer formed over the bottom electrode;
 a first oxygen diffusion barrier layer formed over the resistive switching layer;
 a conductive oxygen reservoir layer formed over the first oxygen diffusion barrier layer; and
 a second oxygen diffusion barrier layer formed over the conductive oxygen reservoir layer;

a third oxygen diffusion barrier layer formed between the memory stacks; and a top electrode formed over the plurality of memory stacks and the third oxygen diffusion barrier layer.

2. The resistive random access memory device as claimed in claim 1, wherein the resistive switching layer comprises hafnium oxide, titanium oxide, tungsten oxide, tantalum oxide, zirconium oxide, or a combination thereof, and has a thickness of about 3 nm to 10 nm.

3. The resistive random access memory device as claimed in claim 1, wherein the first oxygen diffusion barrier layer comprises aluminum oxide and has a thickness of about 0.3 nm to 1 nm.

4. The resistive random access memory device as claimed in claim 1, wherein the conductive oxygen reservoir layer comprises aluminum, titanium, or a combination thereof and has a thickness of about 5 nm to 40 nm.

5. The resistive random access memory device as claimed in claim 1, wherein the second oxygen diffusion barrier layer comprises aluminum oxide and has a thickness of about 0.3 nm to 1 nm.

6. The resistive random access memory device as claimed in claim 1, wherein the second oxygen diffusion barrier layer comprises titanium oxynitride (TiON) and has a thickness of about 3 nm to 10 nm.

7. The resistive random access memory device as claimed in claim 1, wherein the third oxygen diffusion barrier layer comprises aluminum oxide and has a thickness of about 1 nm to 10 nm.

8. The resistive random access memory device as claimed in claim 1, wherein the plurality of memory stacks has a pitch of about 10 nm to 40 nm therebetween.

9. The resistive random access memory device as claimed in claim 1, further comprising:
a first conductive contact formed in a first dielectric layer, wherein the bottom electrode is formed over the dielectric layer and the first conductive contact, and the first conductive contact physically contacts the bottom electrode;
a second dielectric layer formed over the top electrode; and
a second conductive contact formed in the second dielectric layer;
wherein the second conductive contact physically contacts the top electrode;
wherein the first conductive contact and the second conductive contact are diagonally disposed from a top view.

10. The resistive random access memory device as claimed in claim 1, wherein the plurality of memory stacks are formed with a strip-like, square-like, circle-like, ring-like, bended-strip-like configuration, or any patterns which are formed symmetrically and spaced equally from a top view.

11. A method of manufacturing a resistive random access memory device, comprising:
forming a bottom electrode;
forming a plurality of memory stacks separately over the bottom electrode, wherein each of the plurality of memory stacks comprises:
a resistive switching layer formed over the bottom electrode;
a first oxygen diffusion barrier layer formed over the resistive switching layer;
a conductive oxygen reservoir layer formed over the first oxygen diffusion barrier layer; and
a second oxygen diffusion barrier layer formed over the conductive oxygen reservoir layer;
forming a third oxygen diffusion barrier layer between the memory stacks; and
forming a top electrode over the plurality of memory stacks and the third oxygen diffusion barrier layer.

12. The method as claimed in claim 11, wherein the resistive switching layer comprises hafnium oxide, titanium oxide, tungsten oxide, tantalum oxide, zirconium oxide, or a combination thereof, and has a thickness of about 3 nm to 10 nm.

13. The method as claimed in claim 11, wherein the first oxygen diffusion barrier layer comprises aluminum oxide and has a thickness of about 0.3 nm to 1 nm.

14. The method as claimed in claim 11, wherein the conductive oxygen reservoir layer comprises aluminum, titanium, or a combination thereof and has a thickness of about 5 nm to 40 nm.

15. The method as claimed in claim 11, wherein the second oxygen diffusion barrier layer comprises aluminum oxide and has a thickness of about 0.3 nm to 1 nm.

16. The method as claimed in claim 11, wherein the second oxygen diffusion barrier layer comprises titanium oxynitride and has a thickness of about 3 nm to 10 nm.

17. The method as claimed in claim 11, wherein the third oxygen diffusion barrier layer comprises aluminum oxide and has a thickness of about 1 nm to 10 nm.

18. The method as claimed in claim 11, wherein the plurality of memory stacks are formed with a strip-like, square-like, circle-like, ring-like, bended-strip-like configuration, or any patterns which are formed symmetrically and spaced equally from a top view.

19. The method as claimed in claim 11, wherein forming the plurality of memory stacks separately over the bottom electrode comprising:
forming the resistive switching layer over the bottom electrode;
forming the first oxygen diffusion barrier layer over the resistive switching layer;
forming the conductive oxygen reservoir layer over the first oxygen diffusion barrier layer;
forming the second oxygen diffusion barrier layer over conductive oxygen reservoir layer;
sequentially patterning the second oxygen diffusion barrier layer, the conductive oxygen reservoir layer, the first oxygen diffusion barrier layer, and the resistive switching layer to form the plurality of memory stacks separately over the bottom electrode.

20. The method as claimed in claim 11, prior to forming the bottom electrode, further comprising:
forming a first conductive contact in a first dielectric layer, wherein the bottom electrode is formed over the first dielectric layer, and the first conductive contact physically contacts the bottom electrode;
forming a second dielectric layer formed over the top electrode; and
forming a second conductive contact formed in the second dielectric layer, wherein the second conductive contact physically contacts the top electrode;
wherein the first conductive contact and the second conductive contact are diagonally disposed from a top view.

* * * * *